United States Patent
Inamdar et al.

(10) Patent No.: US 10,505,097 B1
(45) Date of Patent: Dec. 10, 2019

(54) SYSTEM AND METHOD FOR ARRAY DIAGNOSTICS IN SUPERCONDUCTING INTEGRATED CIRCUIT

(71) Applicant: HYPRES, Inc., Elmsford, NY (US)

(72) Inventors: Amol Inamdar, Elmsford, NY (US); Jie Ren, Elmwood Park, NJ (US); Denis Amparo, White Plains, NY (US)

(73) Assignee: Hypres, Inc., Elmsford, NY (US)

( * ) Notice: Subject to any disclaimer, the term of this patent is extended or adjusted under 35 U.S.C. 154(b) by 0 days.

(21) Appl. No.: 16/291,669

(22) Filed: Mar. 4, 2019

Related U.S. Application Data

(63) Continuation of application No. 15/097,930, filed on Apr. 13, 2016, now Pat. No. 10,222,416.

(60) Provisional application No. 62/147,455, filed on Apr. 14, 2015.

(51) Int. Cl.
| | |
|---|---|
| *H01L 39/22* | (2006.01) |
| *H01L 27/18* | (2006.01) |
| *H01L 39/14* | (2006.01) |
| *H03K 19/195* | (2006.01) |
| *H01L 39/24* | (2006.01) |

(52) U.S. Cl.
CPC ............ *H01L 39/223* (2013.01); *H01L 27/18* (2013.01); *H01L 39/2493* (2013.01); *H03K 19/195* (2013.01)

(58) Field of Classification Search
None
See application file for complete search history.

(56) References Cited

U.S. PATENT DOCUMENTS

| | | | | |
|---|---|---|---|---|
| 5,942,997 | A * | 8/1999 | Silver | H03M 1/121 341/133 |
| 2008/0101501 | A1 * | 5/2008 | Gupta | H03K 17/92 375/295 |
| 2012/0056620 | A1 * | 3/2012 | Feinberg | G01R 33/4835 324/309 |

* cited by examiner

*Primary Examiner* — Crystal L Hammond
(74) *Attorney, Agent, or Firm* — Tully Rinckey PLLC; Steven M. Hoffberg

(57) ABSTRACT

A superconducting circuit is disclosed for fast digital readout of on-chip diagnostics in an array of devices in an integrated circuit. The digital readout comprises a digital RSFQ multiplexer to select the readout channel. This permits a large number of devices to be tested with a minimum of input and output lines. The devices may comprise digital devices (such as elementary RSFQ cells), or analog devices (such as inductors, resistors, or Josephson junctions) with a SQUID quantizer to generate a digital signal. The diagnostic array and the digital multiplexer are preferably configured to operate as part of the same integrated circuit at cryogenic temperatures.

20 Claims, 14 Drawing Sheets

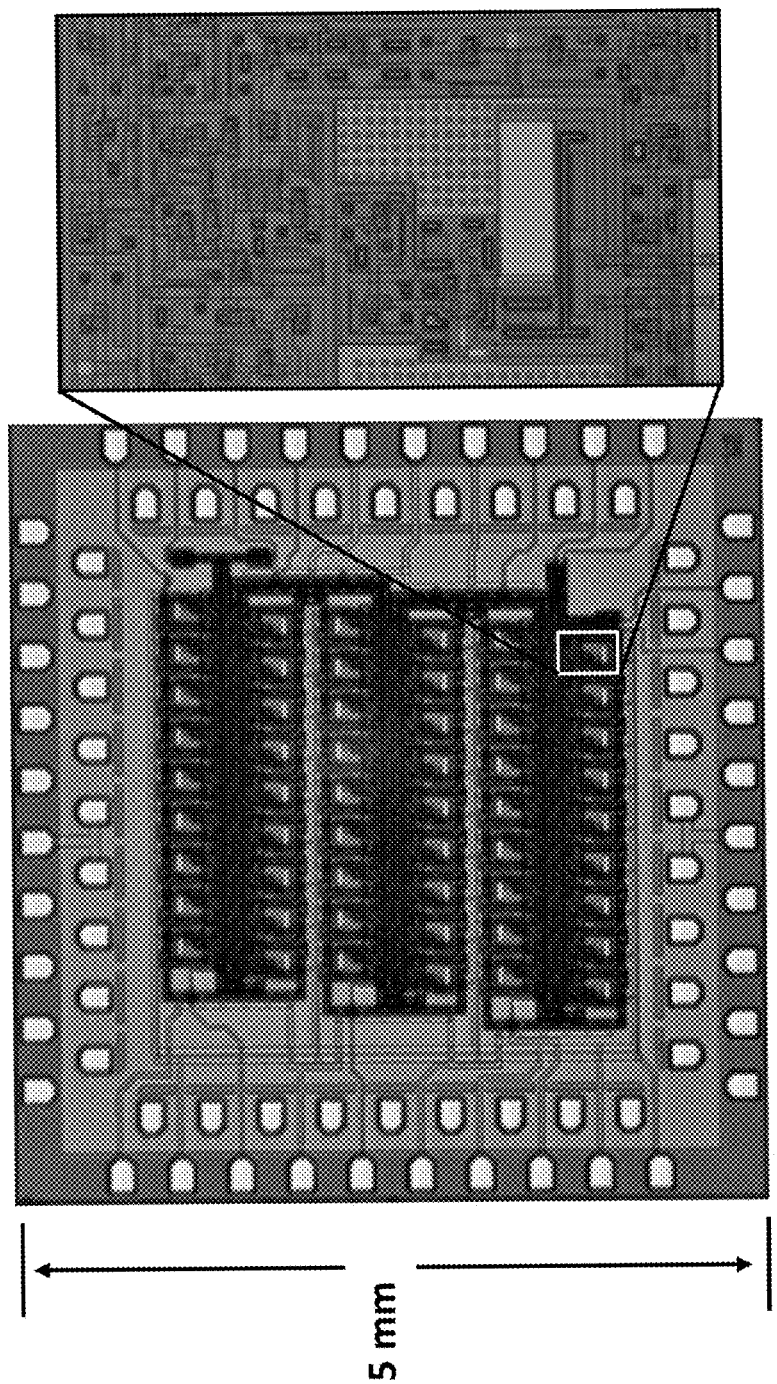

US 10,505,097 B1

SYSTEM AND METHOD FOR ARRAY DIAGNOSTICS IN SUPERCONDUCTING INTEGRATED CIRCUIT

CROSS REFERENCE TO RELATED APPLICATIONS

The present application is Continuation of U.S. patent application Ser. No. 15/097,930, filed Apr. 13, 2016, now U.S. Pat. No. 10,222,416, issued Mar. 5, 2019, which is a non-provisional of U.S. Provisional Patent Application No. 62/147,455, filed Apr. 14, 2015, the entirety of which are each expressly incorporated herein by reference.

STATEMENT OF GOVERNMENT RIGHTS

This invention was made with government support under Grant No. N00014-12-1-0243 awarded by the US Office of Naval Research. The Government has certain rights in the invention.

FIELD OF THE INVENTION

The present invention relates to superconducting integrated circuits. In particular, it relates to diagnostic readout circuits for elements and cells in superconducting integrated circuits.

BACKGROUND OF THE INVENTION

For any integrated circuit technology, elements, devices, and cells must function with reproducible and uniform behavior. But they cannot all be tested individually; this would require an excessive number of input and output contacts. This is particularly important for a technology at the Very-Large-Scale Integration (VLSI) level, with tens of thousands of elements and beyond on a single chip. Ultrafast superconducting digital circuit technology, such as that based on rapid-single-flux-quantum logic (RSFQ), is now developing VLSI circuits, for which diagnostic testing is critical for further scaling to even higher density circuits with millions of elements per chip. RSFQ logic is based on signals comprising a time series of single-flux-quantum (SFQ) voltage pulses, each pulse comprising an integrated voltage over time of a single magnetic flux quantum $\Phi_0 = h/2e = 2.07$ mV-ps, where typically the pulse height is ~2 mV and the pulse width is ~1 ps. Because of the very narrow pulsewidth, RSFQ circuits are known to operate at very high clock speeds up to about 100 GHz, with extremely low power dissipation. They do, however, require cooling to deep cryogenic temperatures for operation, below the superconducting critical temperature Tc of the superconducting material. The most common superconducting material for RSFQ integrated circuits is niobium, with Tc=9.2 K.

One general approach to diagnostic testing is to fabricate an array of nominally identical devices, where different devices in the array may be appropriately activated and measured sequentially, using a minimal number of input and output lines. This is similar in concept to arrays that are used for memories or imaging, where selection techniques may be used to read out a given element in the array. One type of selector is a multiplexer (see, for example, en.wikipedia.org/wiki/Multiplexer), where a plurality of inputs are sent into the multiplexer, and only a single output is selected. A multiplexer may comprise a plurality of selectable switches.

Superconducting Multiplexers and Demultiplexers are known in prior art superconducting electronics technology. See, for example, U.S. Pat. No. 5,982,219 ("Asynchronous Dual-Rail Demultiplexer Employing Josephson Junctions", invented by A. Kirichenko, issued Nov. 9, 1999); and U.S. Pat. No. 8,611,974 ("Systems, Methods, and Apparatus for Superconducting Demultiplexer Circuits", invented by F. Maibaum, et al., issued Dec. 17, 2013), each of which is expressly incorporated herein by reference in its entirety. Superconducting digital switches and switch arrays are also known in the prior art. See, for example, U.S. Pat. No. 7,362,125 ("Digital routing switch matrix for digitized radio frequency signals", invented by D. Gupta and A. Kirichenko, issued Apr. 22, 2008), expressly incorporated herein by reference in its entirety. See also:

A. Kirichenko, "High-speed asynchronous data multiplexing/demultiplexing", IEEE Transactions on Applied Superconductivity, vol. 9, no. 2, pp. 4046-4048, June 1999;

D. L. Miller, et al., "Single-flux-quantum demultiplexer", IEEE Transactions on Applied Superconductivity, vol. 7, no. 2., pp. 2690-2692, June 1997;

L. Zheng, et al., "RSFQ multiplexer and demultiplexer", IEEE Transactions on Applied Superconductivity, vol. 9, no. 2, pp. 3310-3313, June 1999; and L. Zheng, et al., "50 GHz multiplexer and demultiplexer designs with on-chip testing", IEICE Transactions on Electronics, vol. E85-C, no. 3, pp. 621-624, March 2002;

each of which is expressly incorporated herein by reference in its entirety.

One type of superconducting output device in the prior art is the Superconducting Quantum Interference Device, or SQUID, see for example en.wikipedia.org/wiki/SQUID. A SQUID (sometimes called a DC SQUID, although it is not limited to DC applications) comprises two Josephson junctions and an inductive loop, and essentially acts as a sensitive transducer of magnetic flux $\Phi$ (coupled into the loop) to output voltage V. A SQUID actually generates a time series of SFQ pulses, with frequency $f=V/\Phi_0$ (corresponding to a pulse rate of 483 GHz/mV), so it can also be used as a digitizer. Arrays of SQUID outputs with multiplexers have been previously disclosed. See U.S. Pat. No. 5,355,085 (Y. Igarashi et al., "Multichannel SQUID flux meter with multiplexed SQUID sensors", issued Oct. 11, 1994); U.S. Pat. No. 8,593,141 (M. Radparvar and A. Kadin, "Magnetic resonance system and method employing a digital SQUID", issued Nov. 26, 2013), each of which is expressly incorporated herein by reference in its entirety.

See also:

A. M. Kadin, et al., "Superconducting digital multiplexers for sensor arrays", Proc. Int. Conf. on Thermal Detectors (TDW'03), June 2003, available online at ssed.gsfc.nasa.gov/tdw03/proceedings/docs/session_4/Kadin.pdf;

J. Chervenak, et al., "Superconducting multiplexer for arrays of transition edge sensors", Applied Physics Letters, vol. 74, pp. 4043-4045, June 1999; and A. Inamdar, J. Ren, and D. Amaro, "Improved Model-to-Hardware Correlation for Superconductor Integrated Circuits", IEEE Trans. Appl. Supercond., vol. 25, no. 3, June 2015, article 1300308, each of which is expressly incorporated herein by reference in its entirety.

SUMMARY OF THE INVENTION

Consider an array comprising a plurality of devices under test in a superconducting integrated circuit. The devices may comprise analog devices or digital devices (gates). Each device has at least one input and at least one output. Each device is subjected to a standard input, and the device output is read out using a selectable switch. In a preferred embodiment, the plurality of switches is configured as a time-domain multiplexer with only one of the plurality of device outputs connected to the multiplexer output line at a time. In this way, the behavior of the plurality of the elements may be examined, and both the individual outputs and their statistical distribution reconstructed. The switches may be configured as shown in FIG. 1, where only the first switch is ON (closed); the others are OFF (open). At a later time, switch #2 would be on and the others off, and so forth. In a further preferred embodiment, the data input signals to the switches comprise a time-series of SFQ voltage pulses, and the switches function according to RSFQ logic. In the example shown in FIG. 2, the output of the multiplexer yields a pulse train characteristic of device R1, followed by R2, followed by R3.

In a further preferred embodiment, the switches may comprise non-destructive-readout (NDRO) memory cells, one for each device in the array, with a typical circuit schematic shown in FIG. 3, where X indicates a damped Josephson junction, and the inductor associated with the storage loop is shown. The NDRO cell is a standard RSFQ cell, shown for example in the online cell library at Stony Brook University at www.physics.sunysb.edu/Physics/RSFQ/Lib/AR/ndro.html. This can be used as a switch, whereby a pulse into the SET input (which induces a current loop to be stored in the cell) turns the switch ON, so that any pulses into the DATA input are conducted to the OUT output. When a RESET pulse arrives, the switch is turned OFF, and pulses to the DATA input do not propagate. This RESET pulse also causes the stored current to be released as a pulse on the SYNC OUT line, which can be used to turn on the next switch in a series array.

In a further embodiment shown in FIG. 4, the devices being tested comprise analog elements, each biased with a common voltage. The analog output of each element is converted to a digital output (a sequence of SFQ pulses) in an appropriate analog-to-digital converter (ADC), and the converted digital output is fed to the NDRO cell, acting as a digital switch. The output of each NDRO cell is sent to a common multiplexer output line sequentially, based on a SET pulse which is sent to each NDRO switch to turn it on, and a RESET Clock pulse that turns it off and passes the SET pulse to the next NDRO switch. In this way, the signal on the array output line represents a sequential record of the digital representation of the behavior of elements in the array.

FIG. 5 shows an example of an analog element in a diagnostic array, namely a resistor, together with one embodiment of an ADC, based on a SQUID quantizer. A bias voltage V is applied across the resistor, generating a current I=V/R, which passes through the inductor L of the SQUID, generating a magnetic flux $\Phi=LI=LV/R$. The flux modulates the output voltage of the SQUID, and hence the output frequency of SFQ pulses, periodically with $\Phi_0$, as shown for an example in FIG. 6 for varying bias voltage V (actually measured for several elements of a test array). The pulse train due to a given resistor can be selected by the multiplexer, and transmitted to an appropriate digital processing circuit (either on-chip or external) to determine the pulse frequency or converted back to average voltage. Comparing to FIG. 2, the pulse trains exhibit frequencies f=50 GHz, 100 GHz, and 33 GHz, corresponding to SQUID output voltages $\Phi_0 f$=103 µV, 207 µV, and 68 µV, respectively.

From a plot such as FIG. 6, the response period $\Delta V=(R/L)\Phi_0$ can be measured. If L is configured to be accurately known (for example, a relatively large value that can be fabricated precisely), then R can be determined by the formula $R=L\Delta V/\Phi_0$ for each of the resistors of the diagnostic array. Alternatively, the same circuit in FIG. 5 can also be used to measure an array of diagnostic inductors $L=R\Phi_0/\Delta V$, if the resistors R are configured to be accurately known (relatively large values).

FIGS. 7A-7D show an example of one application of the present method: the measured statistical variation of 54 nominally identical inductors (each designed to be 4 pH), in either a straight (FIGS. 7C and 7D) or a right-angle (FIGS. 7A and 7B) design. The "Inductance Distribution" plots (FIGS. 7A and 7C) show the frequency of values in bins of 0.01 pH. The similar plots labeled "Mismatch Distribution" (FIGS. 7B and 7D) examine the difference between measured inductances in adjacent cells, and indicate a tighter distribution in nearby devices.

More generally, this approach can be used to measure the I-V relation for a diagnostic array of nonlinear analog devices, or the amplifier gain $V_{out}/V_{in}$ for a 2-port analog device, or a real-time transient voltage response of a resonator or other analog device with reactive components.

In an alternative embodiment shown in FIG. 8, the Device Under Test is a digital gate rather than an analog element. In this case, the control parameter may comprise digital data (SFQ pulses) instead of (or in addition to) an analog voltage bias, and the output signal from the DUT already comprises a digital signal (SFQ pulse), so that no ADC is needed. This digital gate is not limited to a single-input-single-output device. As indicated in FIG. 8, the input may comprise K bits and the output M bits.

FIG. 9 shows how this digital device embodiment may be configured for a device with two inputs and two outputs. This has two input data lines (DATA1 and DATA2), two NDRO switches, and two output lines.

Such a diagnostic array of digital gates may be used to examine performance margins or bit error rates for a plurality of gates (which may or more not be identical), as a function of bias voltage or clock frequency. Examples of cells that may be examined using this array diagnostic technique include simple cells such as flip-flops, inverters and combinatorial gates, or more complex structures such as shift registers, half-adders, or memory cells.

While these embodiments describe sequential array readout for a linear array of elements, this concept may be extended to a two-dimensional array of readouts, or to selectable readout via an address selection. Also, while the embodiments have illustrated the case of nominally identical elements, one may alternatively fabricate a test array with any combination of nominal element values. In each case, the output permits one to compare the measured values to the nominal values.

It is therefore an object to provide a superconducting digital system, comprising: a plurality of devices under test, each device configured to generate at least one SFQ pulse output in response to an excitation condition; and a superconducting digital multiplexer comprising: a plurality of input ports, one for each device under test, configured to accept the at least one SFQ pulse output of a respective device under test; an output port, configured to propagate the at least one SFQ pulse; and a selectable switch, configured to cause the output port to reproduce the at least one SFQ pulse from a respective single input port, while blocking propagation of SFQ pulses present on all other of the plurality of input ports, dependent on a selectable state.

The at least one device under test may comprise an analog element biased with a reference voltage; and an analog-to-digital converter configured to convert the analog output of the analog element to at least one SFQ output pulse.

The analog-to-digital converter may comprise a SQUID quantizer. The analog-to-digital converter further comprise an analog input and a SQUID quantizer subjected to a magnetic flux corresponding to the signal at the analog input, the analog-to-digital converter having a digitized output comprising an SFQ pulse sequence at a rate that is periodic in the magnetic flux.

A property of the analog element may be measured by examination of the SFQ pulse sequence as a function of the reference voltage which biases the analog element.

A device under test may comprise a digital gate configured to generate at least one SFQ pulse. The digital gate may be activated by at least one SFQ data pulse. The digital gate may be activated by at least one SFQ clock pulse and/or data pulse. The digital gate may have at least one bias condition.

Each of the plurality of devices under test may comprise a nominally identical element, elements having a range of functional properties with incremental variation, or devices having distinct properties. The array may comprise, for example, 10, 16, 32, 50, 54, 64, 100, 128, or more devices under test.

The system may comprise or convey data to an analyzer. Such an analyzer may be configured to analyze the at least one SFQ pulse at the output port, to provide information on a statistical variation of the respective nominally identical element of each of the plurality of devices under test. The analyzer may also be configured to analyze the at least one SFQ pulse at the output port, to provide information on a performance margin of the respective nominally identical element of each of the plurality of devices under test. An analyzer may be provided configured to determine an information content at the multiplexer output port conveyed as a pulse frequency of the at least one SFQ pulse. An analyzer may be provided configured to determine a pulse frequency of the at least one SFQ pulse at the multiplexer output port. The system may further comprise a circuit configured to convert the information content of the multiplexer output port to a time-averaged voltage across a Josephson junction.

The plurality of devices under test and the multiplexer may be fabricated on a common superconducting integrated circuit.

The selectable switch may comprise at least one non-destructive readout (NDRO) memory cell. the at least one NDRO may comprise a SET input, a RESET input, a DATA READ input, a DATA OUT output, and a SYNCH output, wherein each of the plurality of input ports receives a representation of the at least one SFQ pulse output of the respective device under test to the DATA READ input, and the DATA OUT output is configured to transmit a representation of the at least one SFQ pulse output to the output port of the multiplexer if the SET input is selected. The selectable state of the selectable switch may be established dependent on a pulse input to the SET input of one NDRO, to thereby cause the DATA READ input of the one NDRO to be reflected at the output port. The selectable state of the selectable switch may be subsequently established to de-select the one NDRO dependent on a pulse input to the RESET input of the one NDRO, which in turn generates a pulse output from the SYNCH output. The respective SYNCH output of a plurality of the respective NDROs may each be connected to the SET input of a respective adjacent NDRO, so that de-selection of a given NDRO is followed by the selection of the adjacent NDRO. A timing of selection of respective NDROs may be controlled by pulses from a selection clock.

It is a further object to provide a method of digital readout of an array comprising a plurality of elements in a superconducting integrated circuit, comprising the steps of: (a) exciting the array comprising the plurality of elements in a continuous or periodic fashion; (b) generating a sequence of SFQ pulses from each element of the array; (c) conducting the sequence of pulses for each of the plurality of elements to a corresponding plurality of inputs of a digital multiplexer; and (d) selecting a state, within the digital multiplexer, to permit the pulses of only a single selected input of the plurality of inputs for output on a multiplexer output line.

Each of the plurality of elements may be nominally identical and produces a corresponding sequence of SFQ pulses, they may vary incrementally, or have distinct properties.

The method may further comprise analyzing reproducibility of a respective element producing a sequence of SFQ pulses at the multiplexer output line; uniformity between respective elements producing respective sequences of SFQ pulses at the multiplexer output line; a performance of a respective element producing respective sequences of SFQ pulses at the multiplexer output line with respect to a predetermined value; performance of each element of the array; a performance margin of each element of the array; and/or a statistics of individual elements or of a plurality of elements within the array.

The plurality of elements may each comprise analog devices, the exciting the array may comprise applying a bias, and the generating a sequence of SFQ pulses may comprise converting the output of the analog devices in a superconducting analog-to-digital converter.

The plurality of elements may each comprise digital devices, and the exciting may comprise generating a sequence of clock and data pulses to the plurality respective elements.

BRIEF DESCRIPTION OF THE FIGURES

FIGS. 13A and 13B show a layout of a chip comprising a diagnostic array of 54 analog elements (FIG. 13A), with an enlarged view of the layout of a single element (FIG. 13B) similar to FIG. 5.

DETAILED DESCRIPTION OF THE PREFERRED EMBODIMENTS

In order to measure statistical variations of superconductor circuit parameters, a large number of replicated copies of a given device need to be measured on a single chip. To increase the number of devices that can be efficiently measured on the same chip, a novel digital multiplexed read-out scheme was developed. In this scheme, the same reference signal is applied to multiple instances of the devices under test (DUT), and all the DUT outputs are multiplexed to a single output channel; a control signal is applied to select one of the multiple DUTs for readout at a given time.

Figure 1:
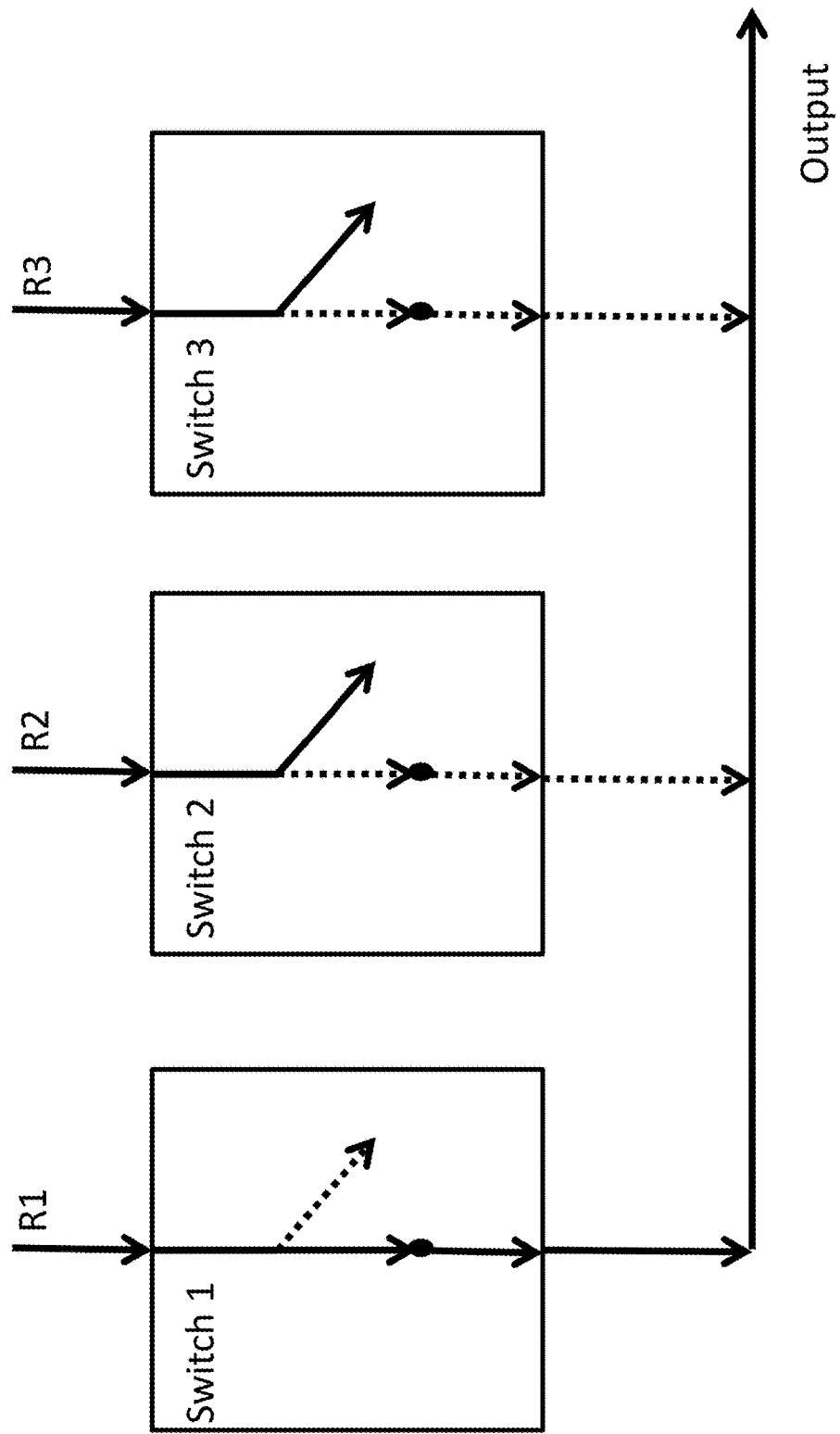
FIG. 1 shows a conceptual diagram of a multiplexer comprising a plurality of switches.
Figure 2:
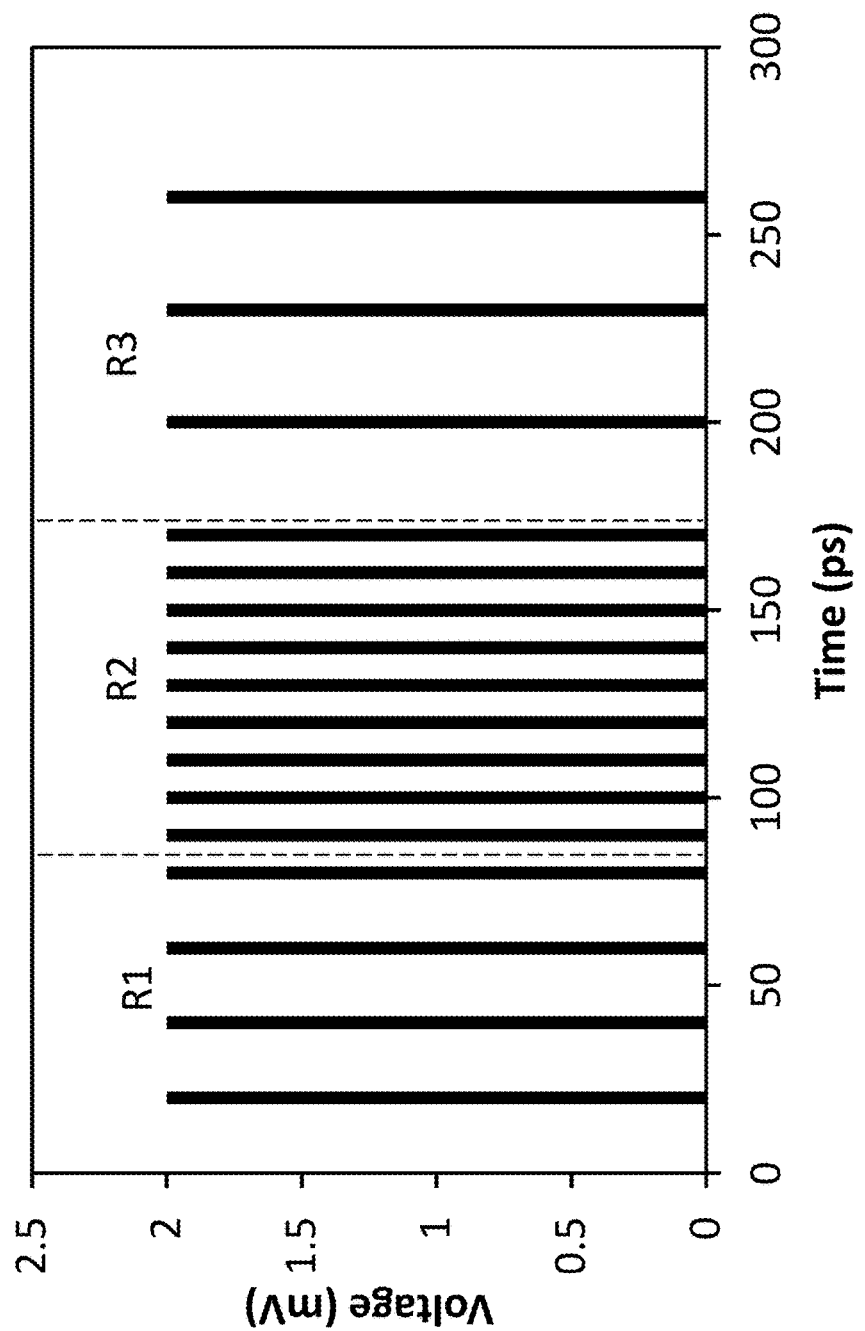
FIG. 2 shows a sequence of SFQ pulses from the output of a digital multiplexer, corresponding to the sequential output from devices R1, R2, and R3.

The basic concept of a time-domain multiplexer based on a plurality of switches is shown in FIG. 1, where signals from a large number of nominally identical elements are presented to an array of switches. The switches are controlled so that only one switch is closed at a time, permitting only the signal from a single element to pass through to the output at a time. In the present case, the signals are sequences of digital SFQ pulses, as shown in FIG. 2. Each voltage pulse has pulse height of ~2 mV and pulsewidth of ~1 ps, although they are not really rectangular. Because of the very fast picosecond timescale, all elements of even a large array can be queried in a short time.

Figure 3:
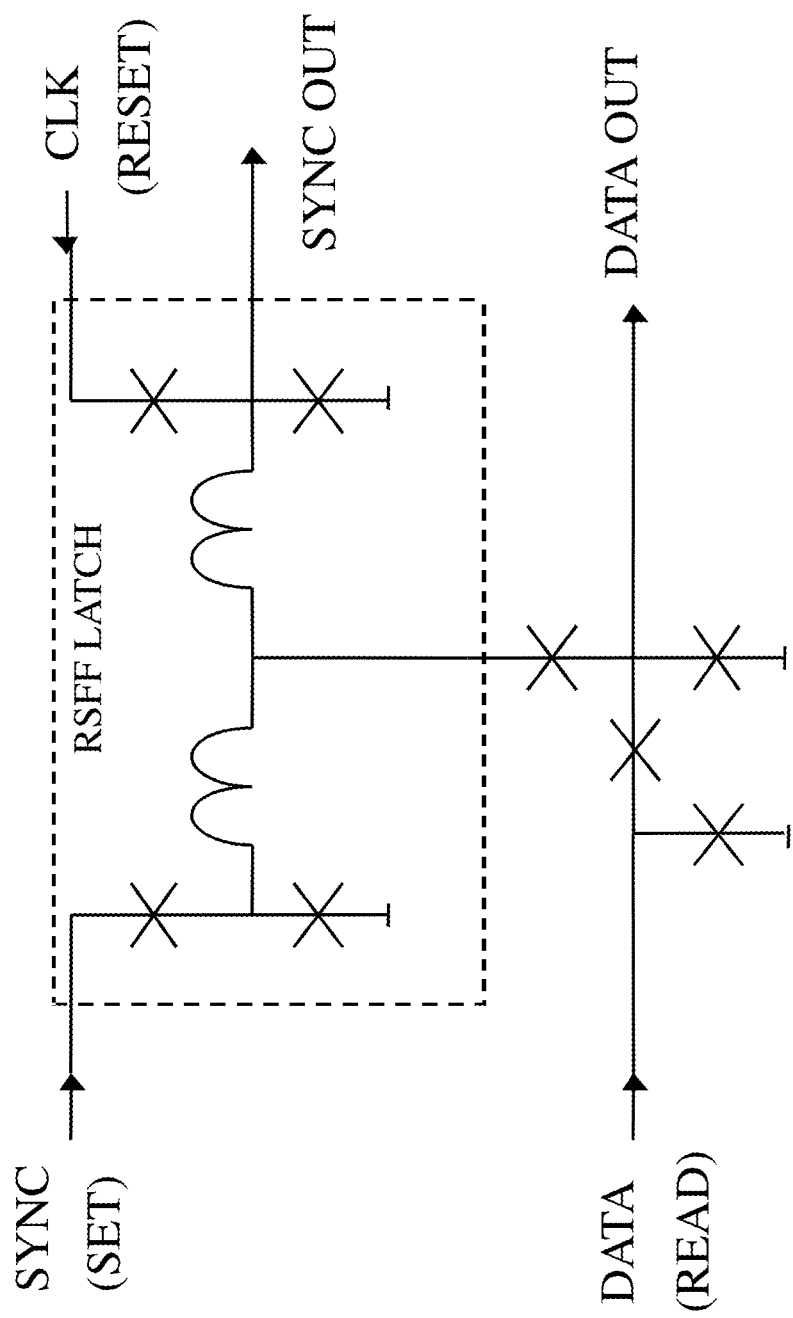
FIG. 3 shows a schematic of an RSFQ non-destructive readout (NDRO) cell functioning as a digital switch.

In a preferred embodiment, the switch comprises an NDRO memory cell, the schematic of which is shown in FIG. 3. The core of this circuit comprises 8 damped Josephson junctions (indicated by X) and inductors (shown as coils), although additional junctions may be added for optimum signal conditioning and isolation. This circuit functions as a memory cell if an SFQ pulse is sent into the SET input. This causes a lossless circulating current in the superconducting inductor to store a bit in the RS flip-flop (RSFF) latch. This state can be read out by an SFQ pulse into the READ input. If the data bit is present, an SFQ pulse is sent out the DATA OUT line. This readout is non-destructive, and can be done repeatedly. The bit storage is ended if an SFQ pulse is sent to the RESET input (also labeled clock or CLK), which also yields an SFQ output on the SYNCH OUT line. The same NDRO cell can also function as a switch if the READ input is regarded as a DATA input line. This DATA signal will propagate on the DATA OUT line if and only if the switch is ON, i.e., if there is a bit stored in the latch due to a prior SET signal, which represents the ON switch. The RESET input represents the OFF switch, and the SYNCH OUT pulse can be used to turn on the next NDRO switch in the line.

Figure 4:
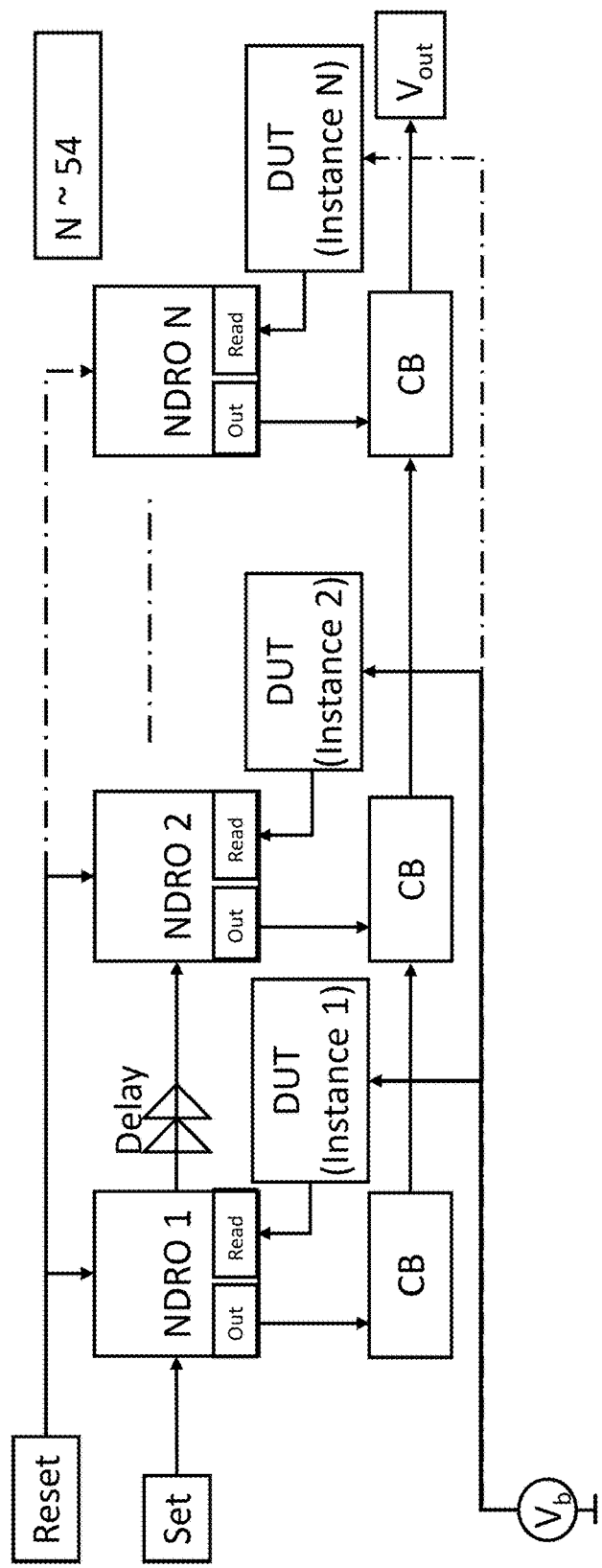
FIG. 4 shows a block diagram of a multiplexed diagnostic measurement of an array of analog elements in a superconducting integrated circuit.

FIG. 4 shows how these NDRO cells may be integrated into a multiplexer readout for diagnostic purposes, for a set of analog Devices Under Test (DUT). All the DUTs are subject to the same bias voltage $V_b$ from a common bias line, and it is assumed that the analog signal from a given DUT is converted to a digital pulse sequence (described in more detail below). All DUTs are on and generating pulses, which enter the DATA (READ) input of an NDRO cell. However, only one cell at a time is turned ON, and only that switch passes the data to the DATA OUT Line, and from there to the comment multiplexer output line.

As shown in FIG. 4, the switch selection signal first goes into the SET input of the first NDRO to turn on the switch. This remains ON until the Switch RESET signal goes into the RESET input of this first NDRO, turning it off. This RESET of an ON switch also causes the release of the memory bit, and the propagation of an SFQ pulse out the SYNCH output on the right, where it goes toward the SET input of the $2^{nd}$ NDRO cell. The RESET pulse also goes into the other RESET inputs of the other NDRO cells, but this has no effect when they are already OFF. So the RESET signal functions as the output clock for the multiplexer.

FIG. 4 also shows the presence of a small time-delay in the line between the SYNCH output of one switch and the SET input of the next switch. This is a very small delay (~several ps), which may be produced by several stages of a standard Josephson transmission line (JTL). Its purpose (in addition to regenerating the pulses) is simply to ensure that one switch is fully turned off before the next switch is turned on, so that there is never data from two switches on the multiplexer output at the same time.

The multiplexer output line in FIG. 4 comprises a standard RSFQ confluence buffer (CB) at each juncture, enabling the output pulses from a given switch to be inserted on the line, while preventing any pulses already on the line from going backwards into any of the other switches. The output signal can either be read out as a sequence of very fast digital pulses, or alternatively, as a time-averaged voltage across a Josephson junction given by $V=\Phi_0 f$, where f is the pulse frequency that may change each time the selection is passed to the next switch.

Figure 5:
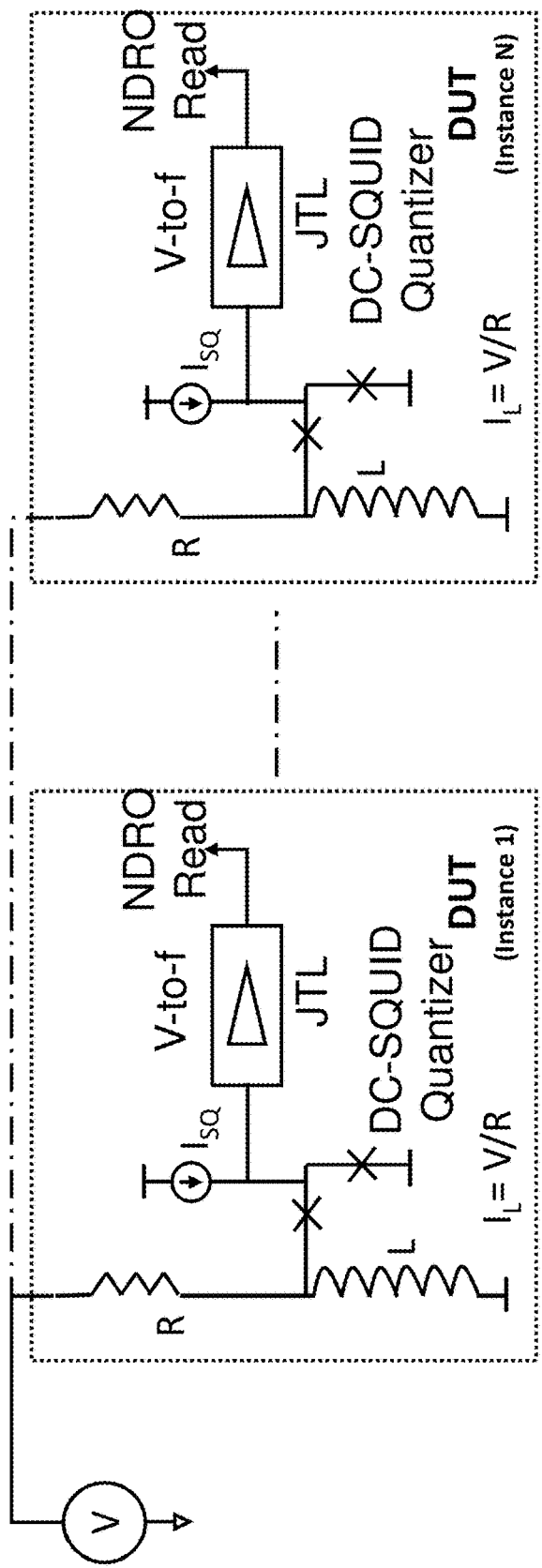
FIG. 5 shows a circuit diagram of a diagnostic measurement of inductors and resistors in a superconducting integrated circuit, together with associated SQUID quantizers.

FIG. 5 shows the detailed circuit of one embodiment of the DUT with its analog-to-digital converter (ADC). This comprises a resistor R and a SQUID quantizer. Small resistors (~10 ohms or less) are generally integrated into superconducting circuits, and the accuracy of their value is important. The SQUID comprises two similar Josephson junctions and a lossless superconducting inductor L, together with a SQUID dc bias current $I_{SQ}$ that is slightly above the parallel critical current of the junctions. In this way, the SQUID is in its voltage state, generating a rapid sequence of SFQ pulses. The presence of magnetic flux $\Phi=LI_L=LV_b/R$ into the SQUID loop modulates the SQUID output voltage, and thus the pulse frequency, periodically in flux $\Phi_0$. These pulses are maintained and regenerated in the JTL and conducted to the DATA input of the NDRO switch.

Figure 6:
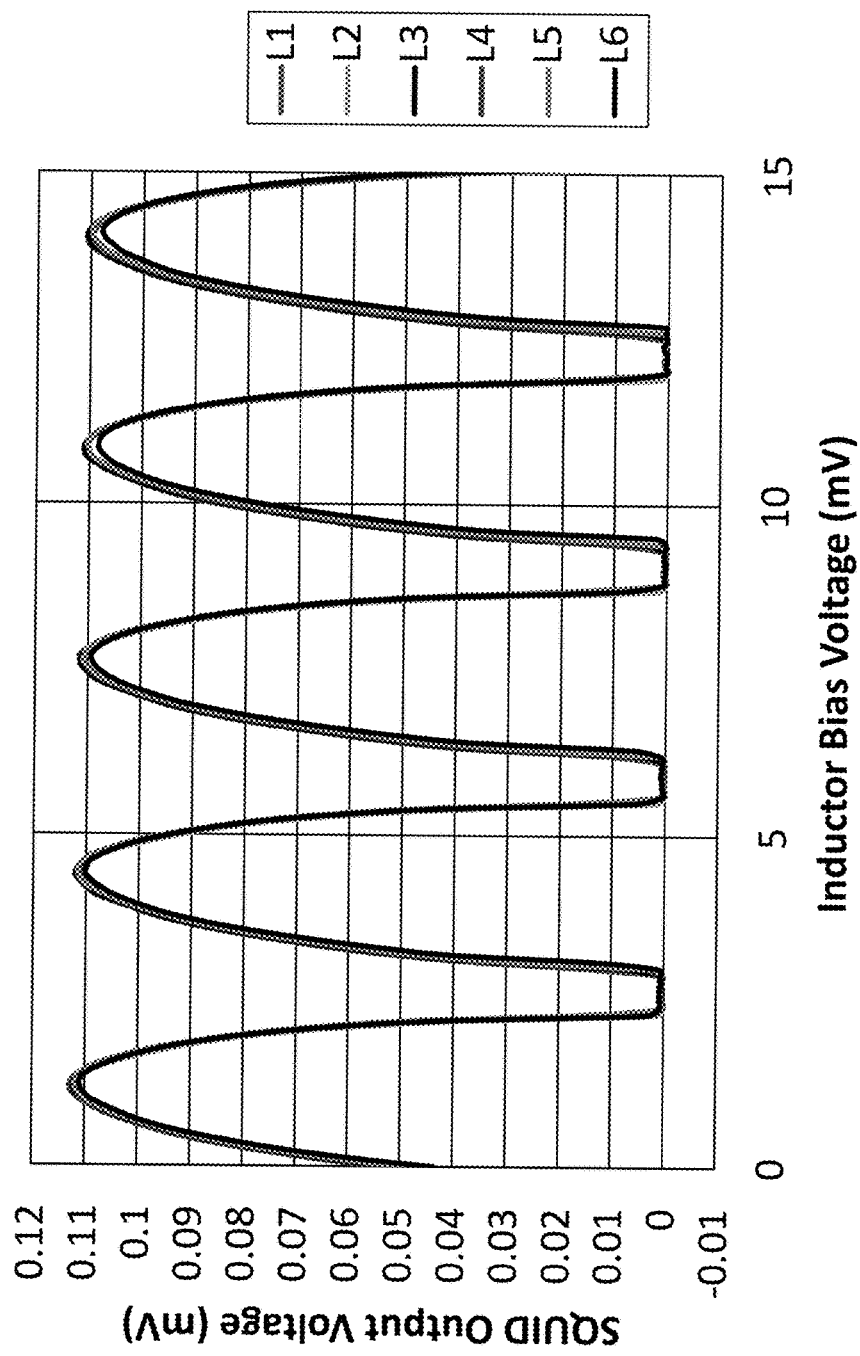
FIG. 6 shows an example of an effective SQUID transfer function that is periodic in magnetic flux for several elements in an array of inductors.
Figure 7A:
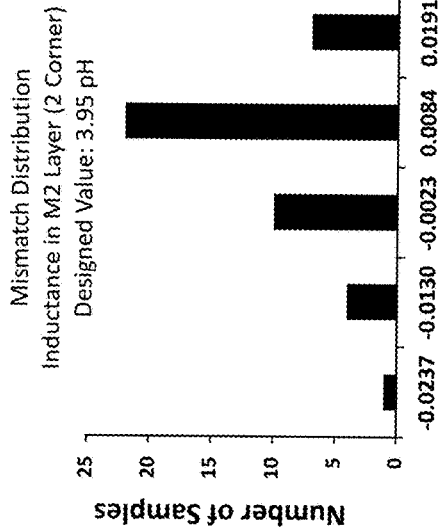
FIGS. 7A-7D show the measured inductance distribution and mismatch distribution for an array of 54 inductors of two different designs.
Figure 7C:
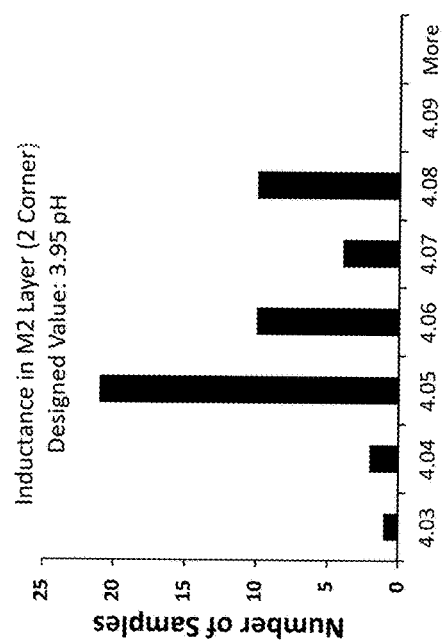
Figure 7B:
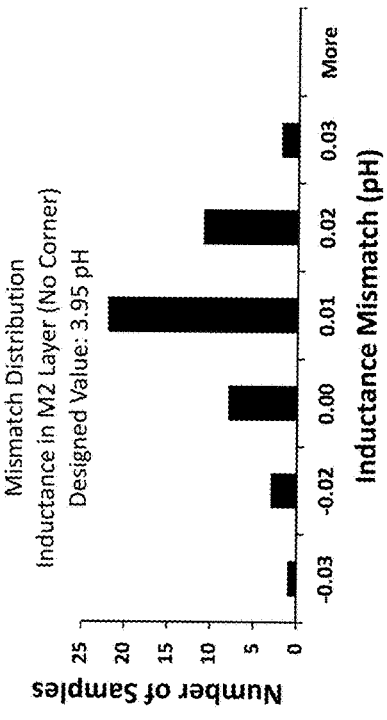
Figure 7D:
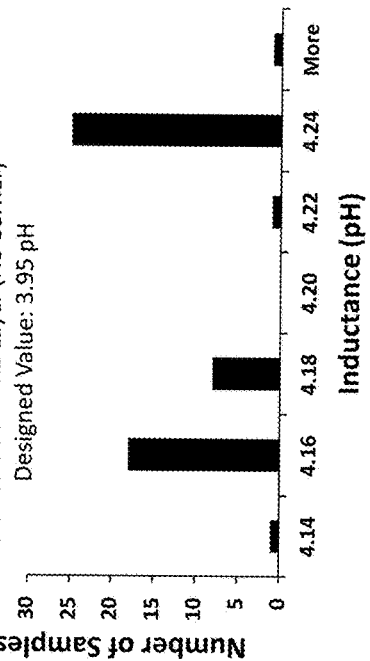

Examples of the periodic SQUID transfer function are shown in FIG. 6, as a function of $V_b$, for 6 different devices in an array of 54 devices. The periodicity is given by $\Delta V_b=\Phi_0 R/L$, although the output voltage itself also depends in part on the Josephson junctions comprising the SQUIDs. This permits one to determine the statistical variation of the parameter L/R, which can be converted to the statistical variation of either L or R if one knows either one of these accurately. For example, one can design a set of devices with a relatively large L and a relatively small R. In this case, the uncertainty in R will be dominant. In the other limit, with a relatively small L and a relatively large R, the uncertainty in L will be dominant.

Figures 10A, 10B:
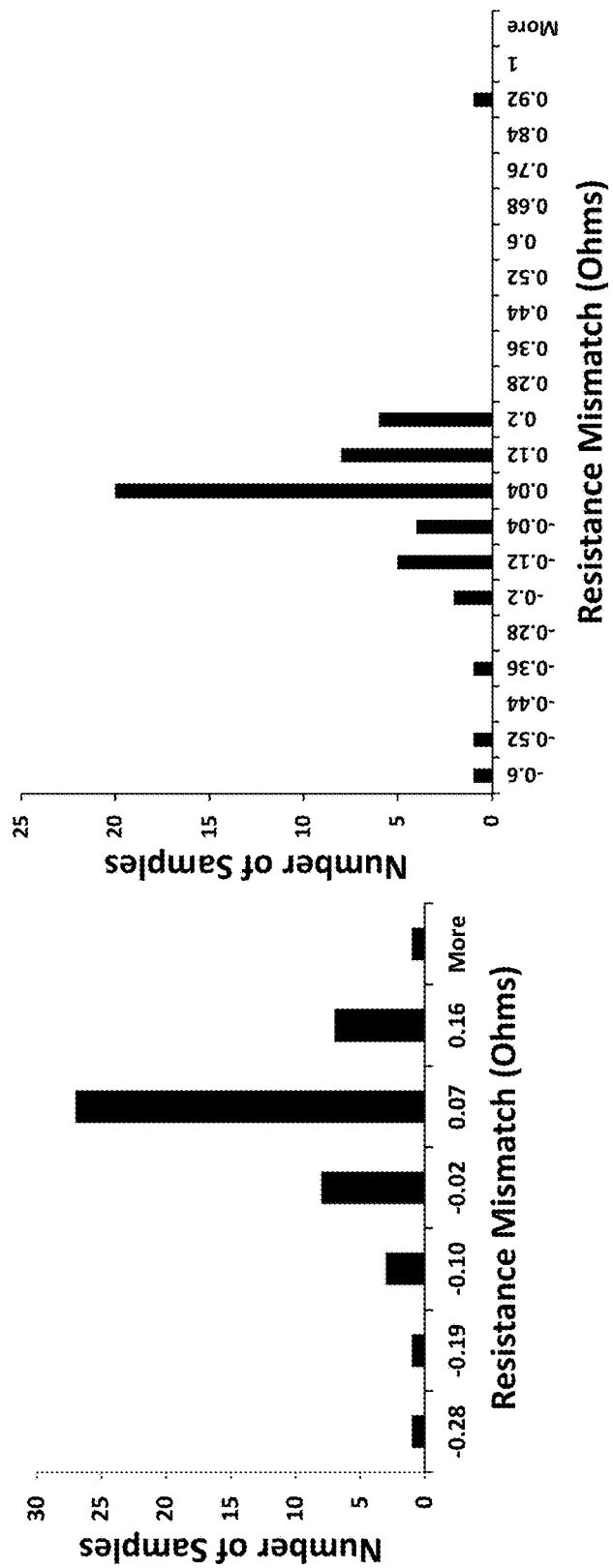
FIGS. 10A and 10B show the measured resistance mismatch distribution for an array of 54 resistors of two different nominal values.
Figure 14B:
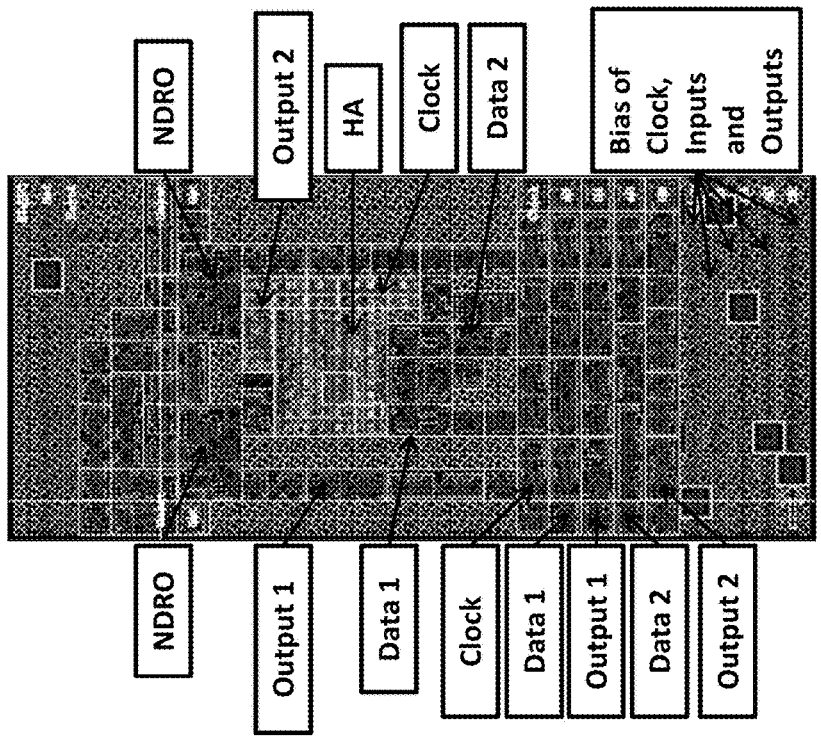
FIGS. 14A and 14B show layouts of section of a diagnostic array of digital elements, similar to FIG. 9, for an inverter (NOT gate, left) and a half-adder cell (HA gate, right).
Figure 14A:
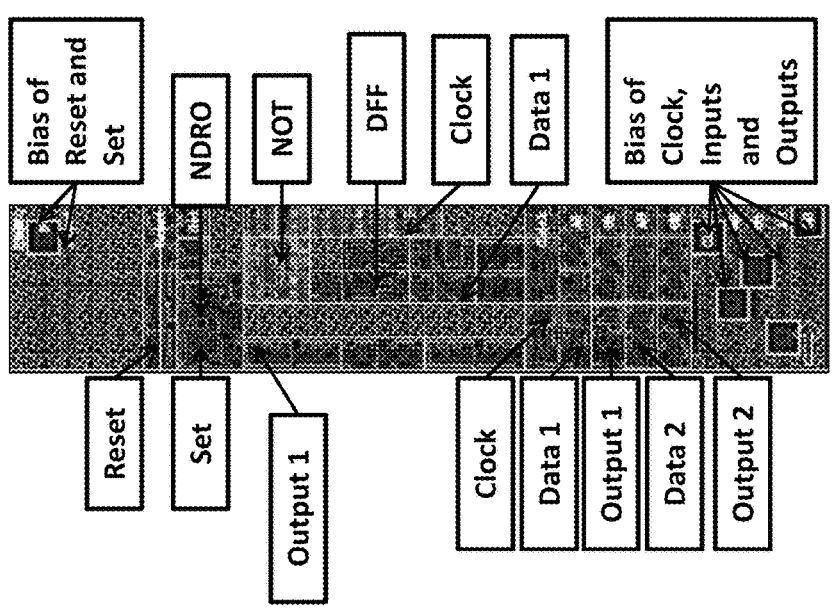

In the case where it is desired to measure a large number of devices on a single integrated circuit on a chip, such a multiplexing scheme substantially reduces the required number of contact pads (for input, output, and control lines), which no longer is a function of the number of devices being tested. The number of devices on a single chip may then be limited only by the available chip area. A diagnostic chip with hundreds or thousands of devices provides much better statistical significance than one with just a few devices. Statistical distributions of resistors and inductors prepared in this way for 54 nominally identical devices are shown in FIG. 7 (inductance distribution and neighbor mismatch distribution for two different designs of inductors) and FIGS. 10A and 10B (mismatch distribution for two different values of resistors). The layout of these 54 devices on a 5-mm chip is shown in FIGS. 14A and 14B, described further below.

Figure 11:
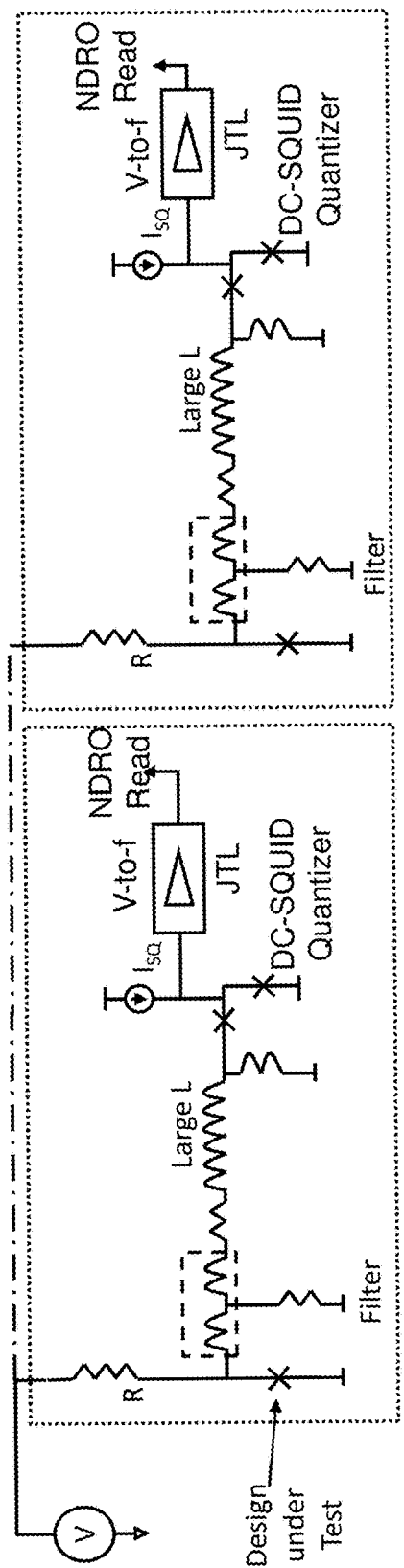
FIG. 11 shows a circuit diagram of diagnostic measurement of Josephson junctions in a superconducting integrated circuit, together with associated SQUID quantizers.

The schematic for the measurement of the critical current $I_c$ of a damped Josephson junction is shown in FIG. 11. For currents below the $I_c$, a Josephson junction acts like a small nonlinear inductance. For currents above $I_c$, the junction generates SFQ pulses, corresponding to an average voltage drop that quickly rises to an equivalent resistance ~1 ohm. For this reason, the circuit in FIG. 11 places the junction in parallel with a large inductor L, and also includes a low-pass filter that blocks the SFQ pulses from entering the SQUID. Below $I_c$, virtually all of the bias current V/R goes to the junction, and virtually none is diverted to the SQUID. But above $I_c$, much of the current V/R diverts to the SQUID, providing (filtered) flux to shift the output voltage. For this test, the output voltage of the SQUID remains at its static operating point while V is being swept, until the junction switches. The critical current of the junction is measured as the $I_c$=V/R at which the SQUID voltage shifts from its static operating point.

Figure 12:
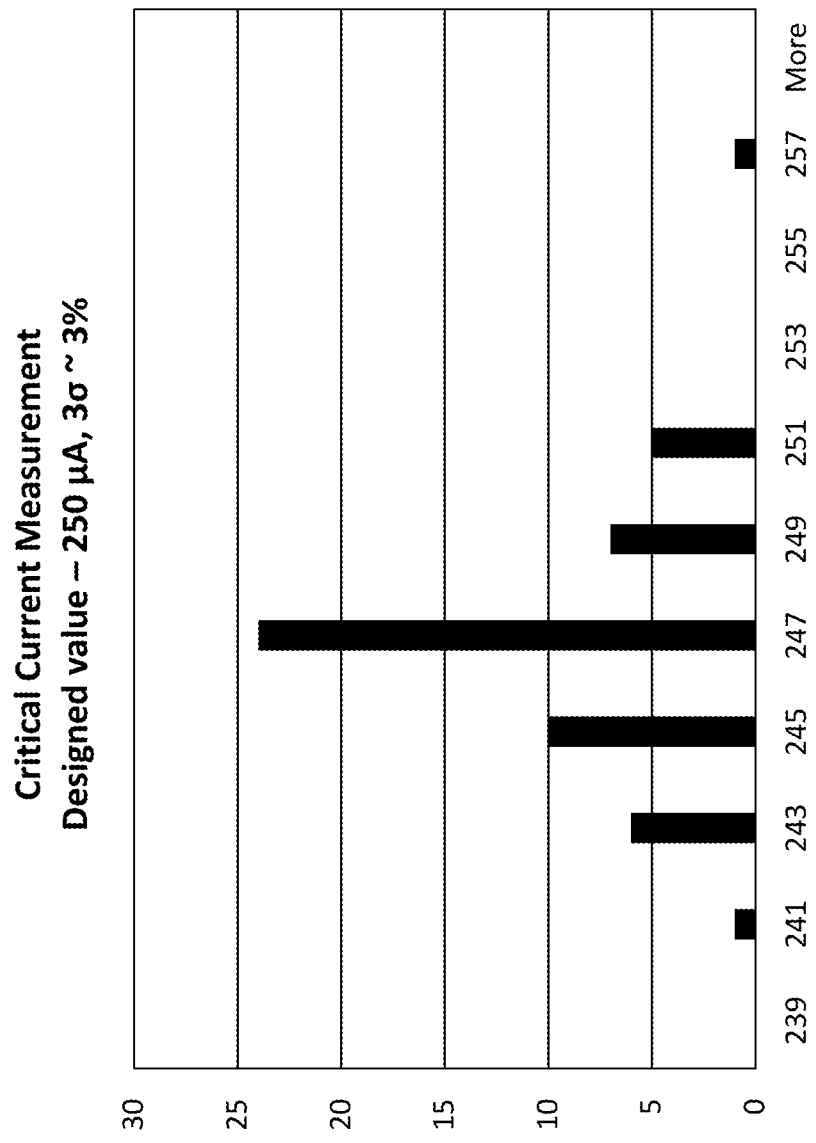
FIG. 12 shows the measured critical current distribution for an array of 54 Josephson junctions.

FIG. 12 shows the statistical variation of the measured values of $I_c$ for an array of 54 devices with a nominal $I_c$=0.25 mA.

Figure 8:
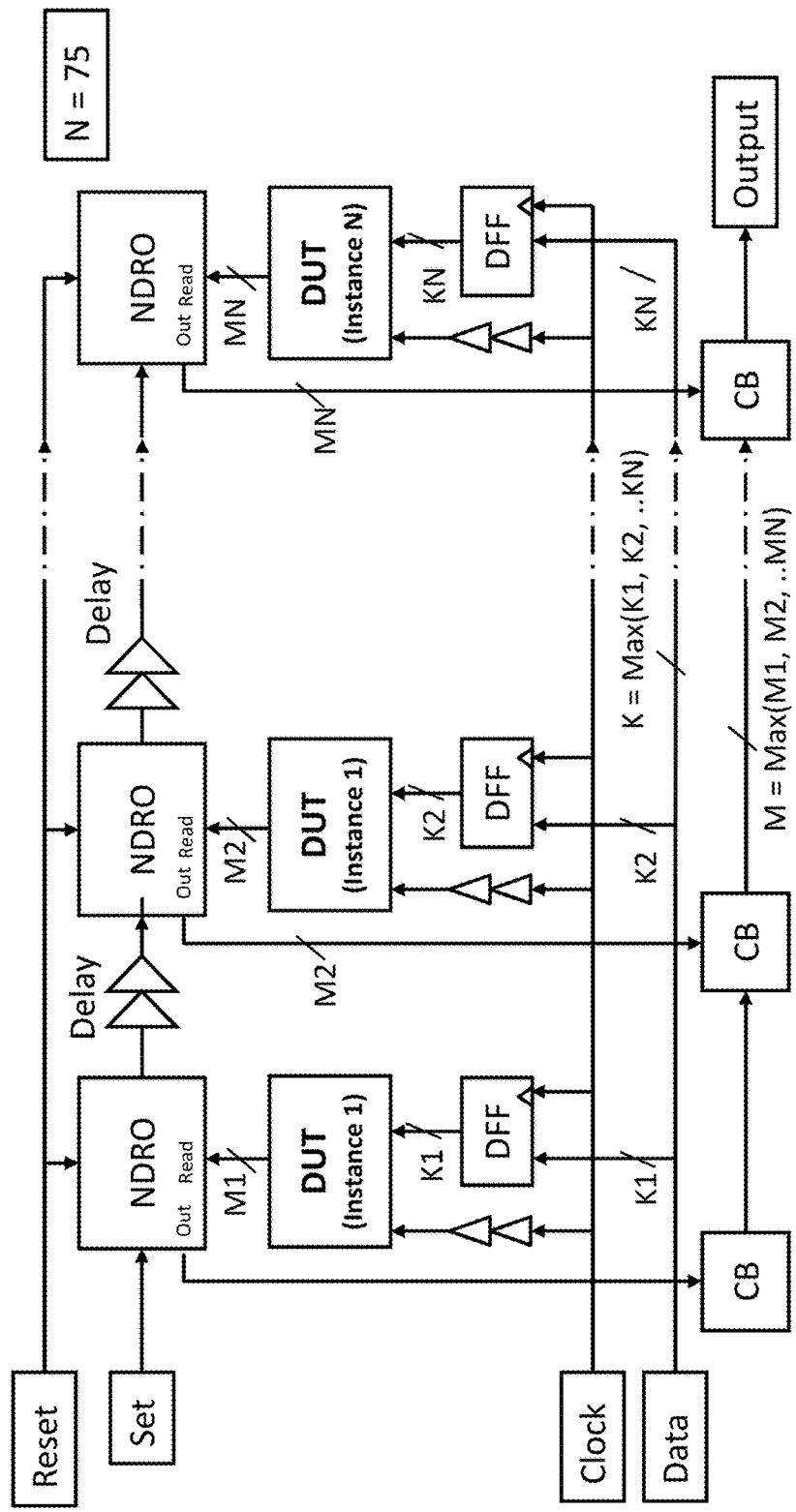
FIG. 8 shows a block diagram of a multiplexed diagnostic measurement of an array of digital gates in a superconducting integrated circuit.

Most of the previous details focused on diagnostic measurement of analog devices, but a similar method can also be applied to digital gates. This is shown in FIG. 8, where a DUT comprises a clocked RSFQ digital gate with K input bits and M output bits. The data bit(s) are first loaded into a memory cell (DFF or D-flip-flop), and then a clock signal sends the data bits into the gate, and the same clock signal activates the gate. (A short time delay is included in the activation line, to avoid race conditions.) In addition, the DUT will typically have one or more bias voltages or currents. The diagnostic information lies in the margins of performance as clock frequency and bias are varied.

While in some cases all gates in the array may be the same, it is also possible for different types of gates to be tested in the same array, provided only that there are sufficient input data lines K=Max(K1, K2, . . . KN) and output lines M=Max(M1, M2, . . . MN) for all of the types of gates.

Figure 9:
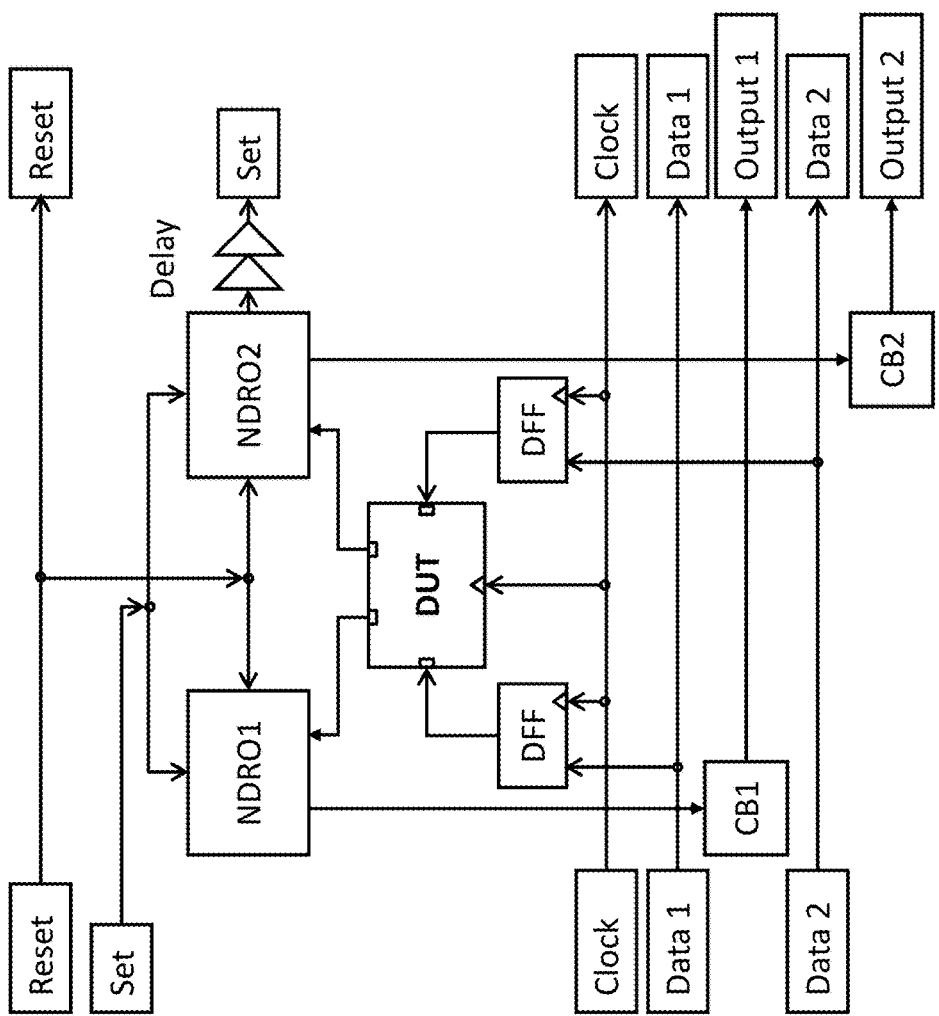
FIG. 9 shows a block diagram for a diagnostic circuit for a digital gate with two inputs and two outputs.

To illustrate this further, FIG. 9 shows a schematic circuit for a digital gate (DUT) with two inputs and two outputs. For example, this might be a one-bit half-adder (HA) cell, with two input bits, a sum output bit, and a carry output bit. Note that this comprises an input buffer (DFF) for each data bit, as well as an NDRO switch and an output line for each data bit.

FIG. 13A shows the chip layout of a diagnostic array of 54 analog devices, using niobium superconducting integrated circuits, as shown schematically in FIGS. 4 and 5. This represents 6 rows of 9 devices per row, all connected to the same meandering output line, on this 5-mm chip. An enlarged view is presented of one of the repeated devices layouts is shown in FIG. 13B. FIG. 13A also shows 40 contact pads around the periphery for signal input and output and bias voltages, together with 36 ground pads inside the contact pads. The use of the multiplexer assures that the number of these pads is sufficient, even for a large number of devices being tested.

FIGS. 14A and 14B show enlarged chip layouts for sections of a diagnostic array to test digital gates. The layout on the right is for a half-adder cell, with two DATA inputs and two OUTPUT lines. The layout on the left is for an inverter (NOT gate), with one DATA input and one OUTPUT line; a second DATA input and second OUTPUT line are not connected but pass through the cell. In this way, both types of gates can be tested as part of the same diagnostic array.

For testing the performance of an array of digital gates, one approach comprises functional testing at low speeds, for clock rates of MHz or below. The input pulse sequences can be generated using conventional electronic sources external to the superconducting circuit, and the output pulse sequences can likewise be measured real-time using conventional digital electronics at room temperature. However, these circuits are designed to operate at clock rates up to 100 GHz, which would make real-time data and measurement difficult. In this case, the input sequence can comprise an on-chip shift register (or a circular shift register for repeated data excitation) that can be downloaded at low speed, but released at high speed. Similarly, the output pulse sequence can comprise an on-chip shift register that can be loaded at high speed, but read out subsequently at lower speed. In this way, diagnostic arrays of high-speed digital gates can be tested up to full speed, and their performance margins calculated.

Other embodiments based on these principles can also be envisioned. For example, for an analog device may have a nonlinear I-V characteristic. If such a device is substituted for the resistor in FIG. 5, this characteristic may be inferred from the response to varying voltage bias. Alternatively, the voltage bias may comprise an AC or square-wave function, so that the response to transients may be examined. For digital circuits, additional information on timing margins can be obtained by incorporating variable time delays in the control circuitry.

In summary, we have presented a general method for providing diagnostic information on a large number of devices in superconducting integrated circuits, based on an RSFQ digital multiplexer. The examples presented were for 54 devices, but hundreds or thousands of devices are possible, which should provide accurate statistics. The feedback provided by such statistics is essential to advance the state of the art of superconducting VLSI fabrication technology.

One skilled in the art will readily appreciate that the present invention is well adapted to carry out the objectives and obtain the ends and advantages mentioned, as well as those inherent therein. The embodiments, methods, procedures and techniques described herein are presently representative of the preferred embodiments, are intended to be exemplary and are not intended as limitations on the scope. Changes therein and other uses will occur to those skilled in the art which are encompassed within the spirit of the invention and are defined by the scope of the appended claims. Although the invention has been described in connection with specific preferred embodiments, it should be understood that the invention as claimed should not be unduly limited to such specific embodiments. Indeed, various modifications of the described modes for carrying out the invention which are obvious to those skilled in the art are intended to be within the scope of the following claims.

What is claimed is:

1. A superconducting digital system, comprising:
   a port configured to provide an excitation condition to each of a plurality of devices under test, each device under test comprising at least one Josephson junction, and being configured to produce at least one output which represents an analog statistical variation with respect to other devices selectively dependent on the excitation condition;
   a superconducting multiplexer comprising:
      a plurality of input ports, one input port for each device under test, configured to accept the at least one output of a respective device under test;
      an output port, configured to propagate the at least one output from a respective device under test, and retain the analog statistical variation of the respective device under test with respect to other devices; and
      a selectable switch, configured to cause the output port to selectively reproduce the at least one output which retains the analog statistical variation with respect to other devices from a respective single input port, while blocking propagation of the at least one output present on all other of the plurality of input ports, selectively dependent on selectable switch state; and
   control circuitry, configured to control the excitation condition and to modify the selectable switch state.

2. The superconducting digital system of claim 1, further comprising at least one device under test, wherein the at least one device under test comprises:
   an analog element biased with a reference voltage; and
   an analog-to-digital converter configured to convert the analog output of the analog element to at least one output pulse.

3. The superconducting digital system of claim 1, wherein at least one device under test comprises an analog element, further comprising an analog-to-digital converter comprising a SQUID quantizer, configured to digitize an analog signal from at least one device under test.

4. The superconducting digital system of claim 3, wherein the analog-to-digital converter comprises an analog input and a SQUID quantizer subjected to a magnetic flux corresponding to the signal at the analog input, the analog-to-digital converter having a digitized output comprising a pulse sequence at a rate that is periodic in the magnetic flux.

5. The superconducting digital system of claim 4, wherein a property of the analog element is measured by examination of the pulse sequence as a function of a reference voltage which biases the analog element.

6. The superconducting digital system of claim 1, further comprising a plurality of bias generators, wherein at least one device under test comprises a digital gate configured to generate at least one pulse, and the digital gate has at least one bias condition controlled by a respective bias generator.

7. The superconducting digital system of claim 1, wherein the plurality of input ports comprise at least 16 nominally identical elements.

8. The superconducting digital system of claim 1, further comprising an analyzer configured to analyze the at least one output at the output port, and to provide information on the analog statistical variation of each of the plurality of devices under test.

9. The superconducting digital system of claim 1, further comprising an analyzer configured to analyze the at least one output at the output port, and to provide information on a performance margin of each of the plurality of devices under test.

10. The superconducting digital system of claim 1, further comprising the plurality of devices under test, wherein the plurality of devices under test and the multiplexer are fabricated on a common superconducting integrated circuit.

11. The superconducting digital system of claim 1, where the selectable switch comprises at least one non-destructive readout (NDRO) memory cell, comprising a SET input, a RESET input, a DATA READ input, a DATA OUT output, and a SYNC output, wherein each of the plurality of input ports receives a representation of the at least one output of the respective device under test to the DATA READ input, and the DATA OUT output is configured to transmit a representation of the at least one output to the output port of the multiplexer if the SET input is selected.

12. The superconducting digital system of claim 11, wherein the selectable switch state of the selectable switch is configured to be established dependent on a pulse input to the SET input of one NDRO, to thereby cause the DATA READ input of the one NDRO to be reflected at the output port, and to be subsequently established to de-select the one NDRO dependent on a pulse input to the RESET input of the one NDRO, to generate a pulse output from the SYNC output.

13. The superconducting digital system of claim 12, whereby the respective SYNC output of a plurality of the respective NDROs are each connected to the SET input of another NDRO, so that de-selection of a given NDRO is followed by the selection of the other NDRO.

14. The superconducting digital system of claim 1, further comprising an analyzer configured to analyze a pulse frequency at the output port.

15. The superconducting digital system of claim 1, further comprising a circuit configured to convert the information content of the output port to a time-averaged voltage across a Josephson junction.

16. A method of controlling an array comprising a plurality of elements in a superconducting integrated circuit, comprising the steps of:
   (a) providing an excitation to each element of the array in a continuous or periodic fashion, to generate an output comprising a sequence of pulses from each respective element of the array, quantitatively representing an analog statistical variation with respect to other elements of the array dependent on the respective excitation;
   (b) receiving outputs from each of the plurality of elements through corresponding inputs of a digital multiplexer;
   (c) selecting a state, within the digital multiplexer, to permit only a single selected input of the plurality of inputs to be represented on an output line of digital multiplexer, while preserving information comprising the analog statistical variation for each of the plurality of elements; and
   (d) selectively controlling the excitation to each element, and the state.

17. The method according to claim 16, further comprising controlling the excitation of a respective element and the state to represent the output of the respective element at the multiplexer output line, and analyzing the multiplexer output line to determine at least one of a reproducibility of the respective element, a uniformity between respective elements, and a performance margin of the respective element.

18. The method according to claim 16, further comprising analyzing at least one of a performance and a performance margin of a respective element with respect to a predetermined value.

19. The method according to claim 16, wherein the plurality of elements each comprise at least one analog device, said providing the excitation to each element of the array comprising applying a controllable bias current, and converting an analog output of the plurality of elements to digital pulses using a superconducting analog-to-digital converter.

20. A superconducting digital multiplexer for interfacing with a plurality of devices, each device having an analog statistical variation, and being configured to generate at least one output in response to an excitation condition representing the analog statistical variation; the system comprising:
  a plurality of input ports, at least one respective input port for each respective device, each respective input port being configured to accept the at least one output of a respective device;
  an output port, configured to propagate the at least one pulse multiplexed from one of the plurality of input ports;
  a selectable switch, configured to cause the output port to reproduce the at least one pulse from a selected respective single input port, while blocking propagation of pulses present on all other of the plurality of input ports, dependent on a received multiplexer control input signal; and
  a control circuit, configured to control a value of the excitation condition, and the multiplexer control signal.

* * * * *